United States Patent
Gilsdorf et al.

(10) Patent No.: US 11,907,136 B2
(45) Date of Patent: Feb. 20, 2024

(54) APPARATUSES, SYSTEMS, AND METHODS FOR INVALIDATING EXPIRED MEMORY

(71) Applicant: Intel Corporation, Santa Clara, CA (US)

(72) Inventors: Ginger H. Gilsdorf, Tempe, AZ (US); Karthik Kumar, Chandler, AZ (US); Mark A. Schmisseur, Phoenix, AZ (US); Thomas Willhalm, Sandhausen (DE); Francesc Guim Bernat, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 744 days.

(21) Appl. No.: 16/820,630

(22) Filed: Mar. 16, 2020

(65) Prior Publication Data

US 2020/0218669 A1    Jul. 9, 2020

(51) Int. Cl.
| | |
|---|---|
| *G06F 12/123* | (2016.01) |
| *G06F 12/0891* | (2016.01) |
| *G11C 7/22* | (2006.01) |
| *G06F 1/14* | (2006.01) |
| *G06F 12/02* | (2006.01) |

(52) U.S. Cl.
CPC .............. *G06F 12/123* (2013.01); *G06F 1/14* (2013.01); *G06F 12/0246* (2013.01); *G06F 12/0891* (2013.01); *G11C 7/22* (2013.01)

(58) Field of Classification Search
CPC ...... G06F 12/123; G06F 1/14; G06F 12/0246; G06F 12/0891; G06F 2212/1024; G06F 3/0652; G06F 3/0617; G06F 21/78; G06F 2221/2143; G11C 7/22; G11C 13/0061; G11C 16/32; G11C 7/24; G11C 13/0035; G11C 16/3495
See application file for complete search history.

(56) References Cited

U.S. PATENT DOCUMENTS

| | | | |
|---|---|---|---|
| 2009/0019341 A1* | 1/2009 | Emma | G11C 7/1006 714/E11.002 |
| 2013/0268717 A1* | 10/2013 | Scouller | G06F 12/0246 711/E12.008 |
| 2016/0299715 A1* | 10/2016 | Hashimoto | G06F 3/0652 |
| 2017/0090783 A1* | 3/2017 | Fukutomi | G06F 11/07 |
| 2017/0286288 A1* | 10/2017 | Higgins | G06F 12/0246 |
| 2018/0136850 A1* | 5/2018 | Ignomirello | G06F 3/061 |
| 2018/0234393 A1* | 8/2018 | Gram | H04L 9/0872 |
| 2020/0042181 A1* | 2/2020 | Lee | G06F 3/0679 |
| 2021/0090669 A1* | 3/2021 | Pawlowski | G06F 12/0246 |
| 2021/0232499 A1* | 7/2021 | Yong | G06F 12/0882 |

* cited by examiner

*Primary Examiner* — Tasnima Matin
(74) *Attorney, Agent, or Firm* — Schwabe, Williamson & Wyatt, P.C.

(57) ABSTRACT

An apparatus and/or system is described including a memory device including a memory range and a temporal data management unit (TDMU) coupled to the memory device to receive from an interface, the memory range and a temporal range corresponding to validity of data in the memory range, check the temporal range against a time and/or date value provided by a timer or clock to identify the data in the memory range as expired, and invalidate the data that is expired in the memory device. In some embodiments, the TDMU includes hardware logic that resides on a memory module with the memory device and is coupled to invalidate expired data when the memory module is decoupled from the interface. Other embodiments may be disclosed and claimed.

20 Claims, 5 Drawing Sheets

APPARATUSES, SYSTEMS, AND METHODS FOR INVALIDATING EXPIRED MEMORY

FIELD

Embodiments of the present disclosure generally relate to the field of integrated circuits (IC), and more particularly, to memory devices.

BACKGROUND

Data retention and aging policies are becoming increasingly important. For example, there may be limits on how long data can be retained as well as requirements that data be retained for a defined time span (e.g., for the purpose of prevention, investigation, detection, and prosecution of criminal offenses). For example, data that may be subject to such regulations include, e.g., phone call time, duration, call recipient information, Internet Protocol (IP) address, connection time, and location data for cell phone connections. Data handling is required to be dynamic because retention may be determined by various policies (e.g., how/when data is ingested, the type/source, and how it should be handled). A data aging policy may require that data be deleted from memory after a certain amount of time has passed. In some cases, such as for example, with persistent memory, even data being operated on may sometimes remain in memory. This is due to the use of persistent media (materials) where persistence is an inherent property of the memory itself (e.g., phase change memories, 3DXPOINT™-based persistent memories) and there is no need for power supply to retain data. In various memories (not limited to persistent memories) when the power supply is removed, e.g., a module or drive including the memory is transported to a different location, data continues to reside in the memory.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
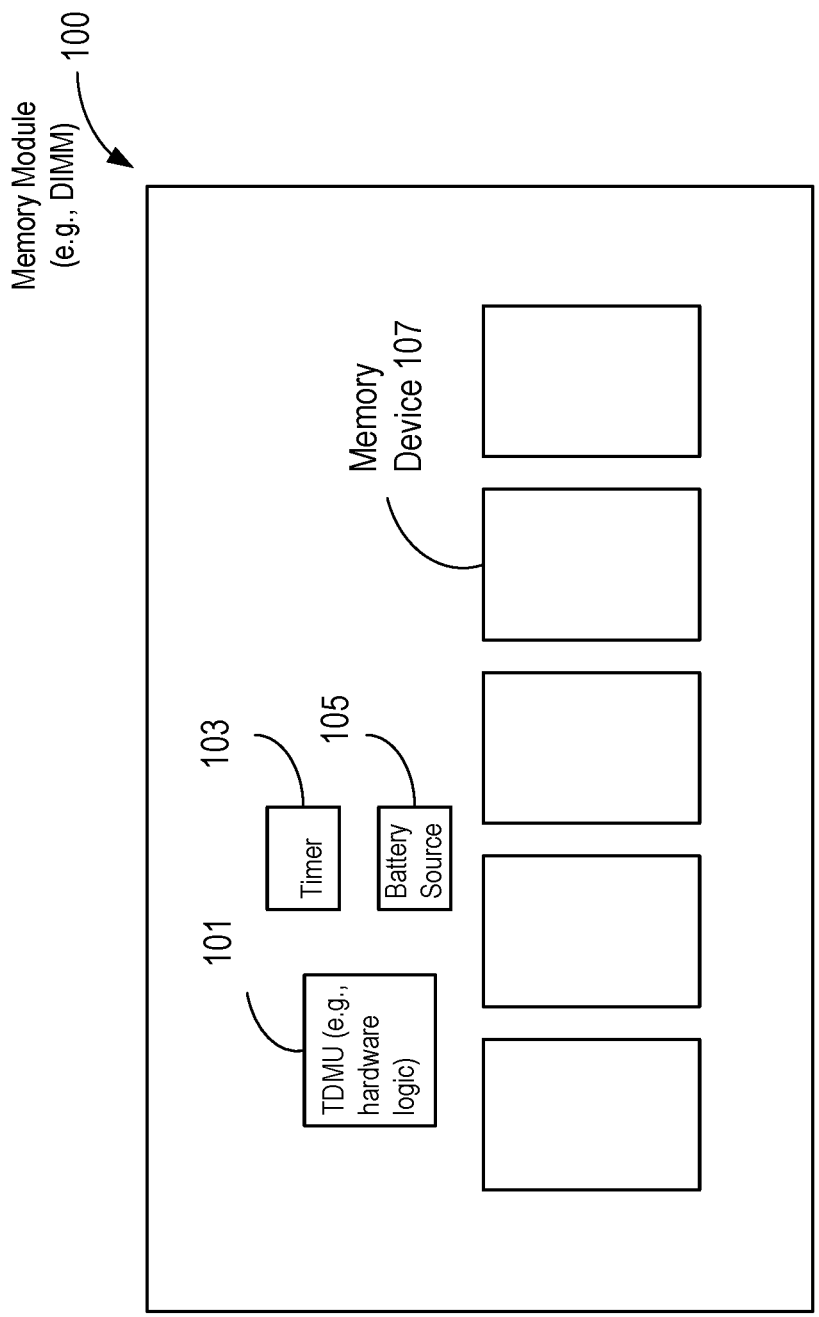
FIG. 1 is simplified diagram illustrating an example memory module, in accordance with embodiments of the present disclosure.

In embodiments described herein, a temporal data management unit (TDMU) receives a memory range of a memory device and a temporal range corresponding to validity of data in the memory range. In embodiments, the memory range is an address range corresponding to memory locations in a memory device. In embodiments, the memory locations include data subject to a data aging policy. In embodiments, the temporal range includes a time range during which the data in the memory locations are valid and the TDMU includes hardware logic to check the temporal range against a time value provided by a timer or clock to identify the data in the memory range as expired and invalidate the expired data in a memory device. In some embodiments, a memory module includes the TDMU and the memory device as well as a timer (or clock) and a battery source. In some embodiments, the TDMU invalidates expired data when memory module is decoupled from an interface (e.g., a memory controller or other platform interface).

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

In some cases, various operations will be described as multiple discrete operations in turn, in a manner that is most helpful in understanding the present disclosure; however, the order of description should not be construed to imply that these operations are necessarily order dependent. In particular, these operations need not be performed in the order of presentation.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. Furthermore, it is to be understood that the various embodiments shown in the Figures ("FIGS.") are illustrative representations and are not necessarily drawn to scale. Note that because memory modules, e.g., such as dual in line memory modules (DIMMs), can be moved from system to system (resulting in data aging policies being lost), a data aging policy may need to reside with the memory module. There is a need for a fine-grained hardware mechanism to manage data lifetimes, especially in the case of persistent memory. As noted above, aging mechanisms can be easily bypassed in software, simply by resetting a clock or timer.

FIG. 1 is a simplified diagram illustrating an example memory module, in accordance with embodiments of the present disclosure. As shown, in FIG. 1, a memory module 100 includes a temporal data management unit (TDMU) 101, a clock or timer 103, battery source 105, and a plurality of memory devices 107 (for clarity in the FIGS., only one memory device 107 is labeled). In embodiments, TDMU 101, e.g., including hardware logic, resides on memory module 100 with one or more memory device(s) 107 and as will be discussed in more detail with respect to FIG. 2, invalidates expired data when memory module 100 is decoupled from an interface (e.g., a memory controller interface). In embodiments, memory module 100 is any suitable memory module or memory board that is coupled to or integrates one or more memory devices that store data. In embodiments, the memory device includes any volatile memory or non-volatile memory having a plurality of memory ranges that store data that may require deletion or invalidation according to a memory aging policy. Note that data aging policy in the context of the disclosure refers to any instruction, direction, requirement, or similar characteristic, that stored data be deleted or otherwise inaccessible at a future time and/or date.

As noted above, in embodiments, the memory range is an address range (logical or physical address range) describing specific memory locations that include data subject to a data aging policy. In embodiments, the temporal range represents a time range during which the data in the memory locations are valid. Thus, in embodiments, a memory range includes, e.g., a logical or a physical address range that identifies specific memory locations that store data to be invalidated upon expiration. In some embodiments, the memory range includes a starting physical memory address and a length of the address range. In embodiments, memory module 100 is a dual-in-line-memory module (DIMM).

Figure 5:
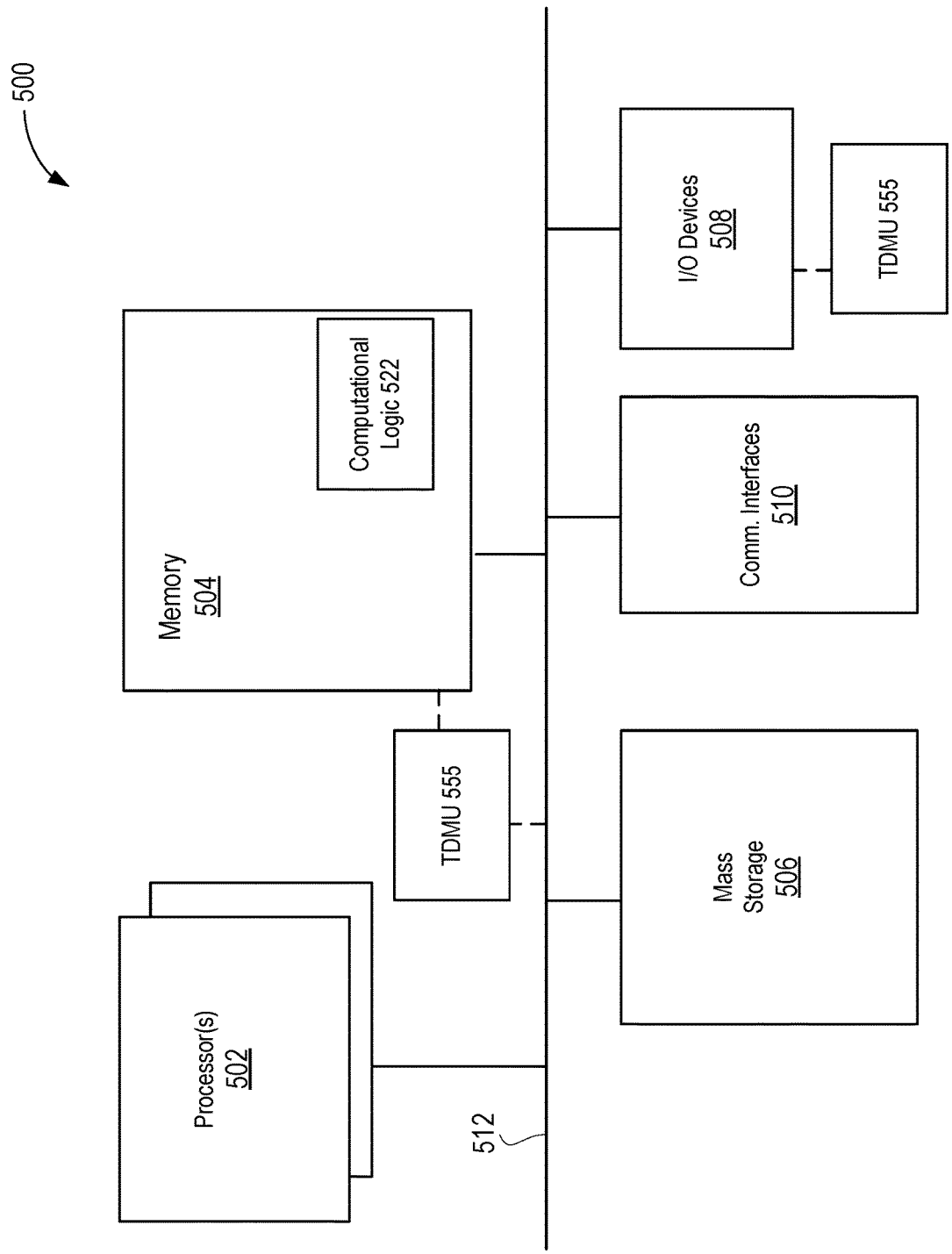
FIG. 5 illustrates a computing system, in accordance with embodiments of the present disclosure.

In embodiments, battery source 105 charges when memory module 100 is coupled to an interface of a memory controller or platform such as a host system (e.g., see FIG. 5). Accordingly, in embodiments, battery source 105 provides timer 103 with power and may continue to provide timer 103 with power when a power supply from a host system computer is absent. As will be discussed further below, in embodiments, timer 103 provides a current time value for determining whether the temporal range for validity of the data has expired. In embodiments, the current time value can be checked against a timestamp associated with the memory range, where the timestamp indicates an initial time of data storage. Note that in embodiments, memory device 107 included on the DIMM is discussed in more detail with respect to FIG. 5 and includes any suitable type of non-volatile (NVM) memory that includes data that is to be invalidated due to, e.g., a data aging policy. In other embodiments, TDMU does not need to be located on a memory unit such as a memory module board but may be coupled to any memory device that includes any suitable type of NVM memory and is configured to store data that is to be invalidated due to, e.g., a data aging policy. In various embodiments, TDMU may be located in a memory drive or may be embedded memory in a processor.

Figure 2:
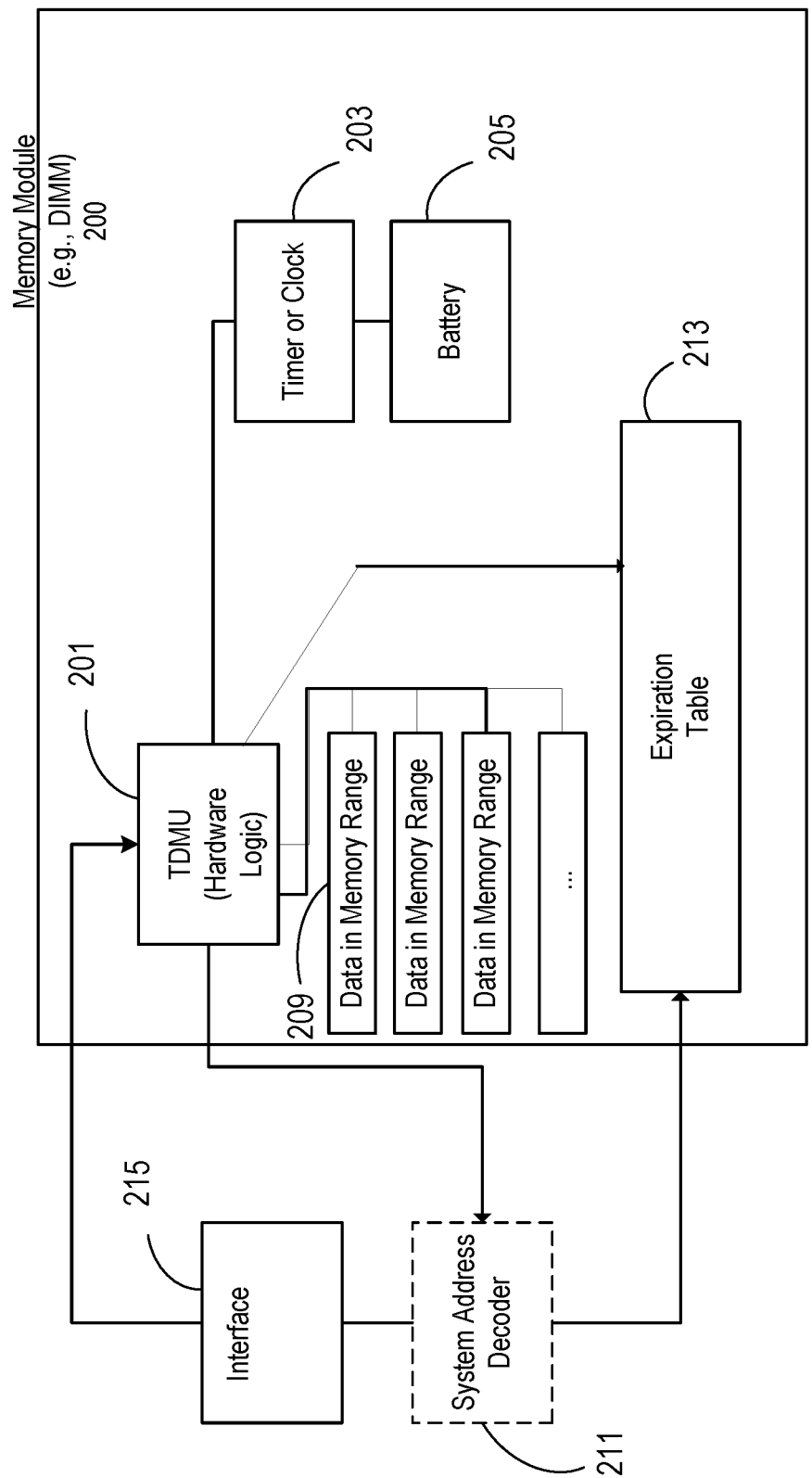
FIG. 2 is functional diagram including an example memory module similar to the memory module of FIG. 1, in accordance with embodiments of the present disclosure.

FIG. 2 is a simplified functional diagram illustrating an environment including a memory module, in accordance with embodiments of the present disclosure. As shown, a memory module 200 is similar to a memory module 100 of FIG. 1 and includes a TDMU 201, timer 203, and a battery 205. A plurality of data in memory range blocks 209 represent actual data itself stored in a memory media of a memory device (e.g., memory device 107 of FIG. 1). In embodiments, TDMU 201 is coupled to an interface 215 (e.g., a memory controller interface) and/or system address decoder 211.

In embodiments, system address decoder 211 is implemented by hardware logic of TDMU 201. In other embodiments, system address decoder 211 is included or implemented by a memory controller outside of the DIMM. In embodiments, TDMU 201 includes hardware logic to receive from interface 215, a memory range and a temporal range corresponding to validity of data (e.g., data in memory range blocks 209) in the memory range. In embodiments, the temporal range includes a time range or other information from which an expiration date for the data stored in the memory range can be determined. For example, in some embodiments, the temporal range includes how many units of time that data in the memory range will be valid (e.g., represented by units, e.g., milliseconds (ms), seconds, or hours, and a number (e.g., 10)). In embodiments, the temporal range is a time-to-live (TTL) value. In embodiments, the memory range and the temporal range are represented by a memory mapping function that includes at least a memory address, length, and TTL value, e.g., mmap (*addr, length, . . . , TTL). For example, if data is to be deleted after 17520 hours (one calendar year) and the unit is one hour, when TDMU 201 checks the temporal range, using the current time and/or date, it may successively decrement the time value for each hour that has elapsed from a timestamp associated with storage of the data to determine if the data has expired.

Note that as shown in FIG. 2, TDMU 201 monitors an expiration table 213 to identify expiration dates and which action in expiration table 213 is to be taken. Thus, in embodiments, TDMU 201 checks the temporal range against a timer to identify the data in the memory range as expired and then invalidates the data that is expired in the memory device. In embodiments, TDMU 201 includes hardware logic including circuitry and/or firmware and circuitry coupled to memory device 107 to perform operations associated with invalidating the expired data (e.g., see Actions associated with FIG. 3) and/or issue commands to memory device 107 to perform the same. In embodiments, the temporal range is a time-to-live (TTL) value and when the TTL value is expired, data in memory range 209 is identified as expired. Note that in embodiments, clock or timer 203 keeps track of a current date and time relative to a beginning time associated with storage or the data or timestamp and for security reasons, may be implemented without an option to be reset.

In embodiments, as is discussed further below, TDMU 201 invalidates expired data using any suitable method to ensure the expired data may not be accessed, such as e.g., marking the memory range as expired with, e.g., a metadata flag, and/or clearing or zeroing a memory range encryption key, or forcibly writing zeros into the data location that may be stored in memory device 107.

As touched on in connection with FIG. 2, in other embodiments, TDMU 201 may be implemented by a memory controller rather than on the memory module, e.g., DIMM board itself. Thus in other embodiments, system address decoder 211, located in a coupled memory controller of a central processing unit (CPU) may monitor expiration table 213 to identify whether the data in the memory range is expired and which action in expiration table 213 is to be taken.

Figure 3:
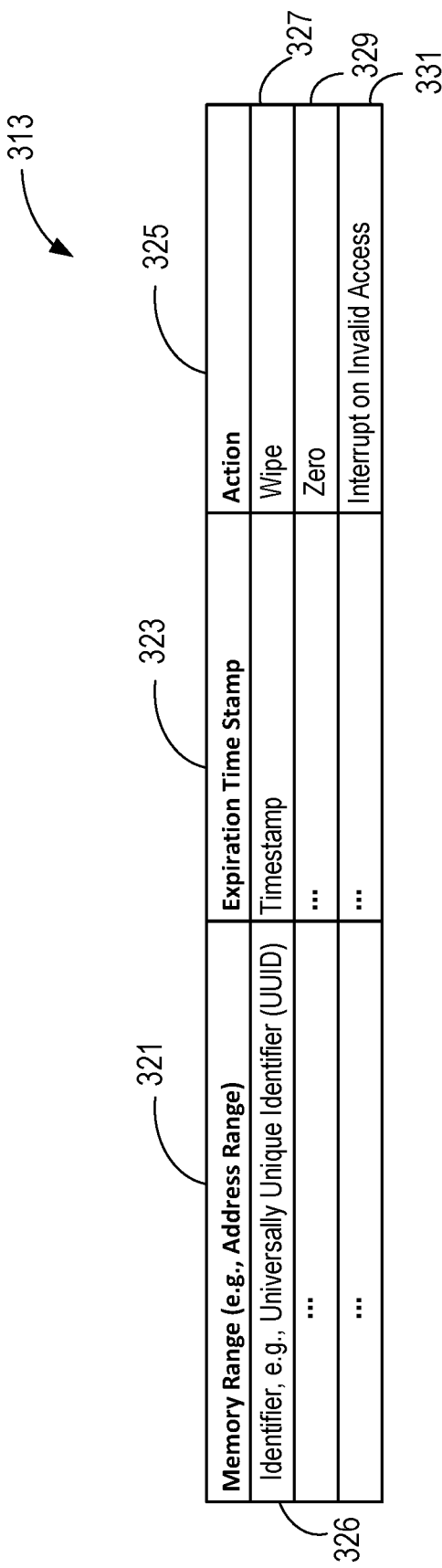
FIG. 3 is an example data expiration table associated with the embodiment of FIG. 2, in accordance with embodiments of the present disclosure.

FIG. 3 is an example data expiration table associated with the embodiment of FIG. 2, in accordance with embodiments of the present disclosure. Data expiration table 313 may be similar or the same as data expiration table 213 of FIG. 2. In some embodiments, data expiration table is stored in a section of a memory device (e.g., memory device 107 of FIG. 1) that is reserved for the data expiration table or other information related to tracking data that is to be invalidated. As shown, data expiration table 313 includes three columns, Memory Range 321, Expiration Time Stamp 323, and Action 325. Note that data expiration table merely is an example and may include fewer or more elements as is suitable to assist TDMU 201 in determining which data should be invalidated. In embodiments, Memory Range 321 is a column for identifiers, e.g., identifier 326, each of which uniquely tracks an address range and is correlated with a particular set of data. In the example, identifier 326 includes, e.g., a Universally Unique Identifier (UUID). In embodiments, identifier 326 correlates to a definition of how long the data should exist and an appropriate action upon expiration. For example, as shown, identifier 326 corresponds to a timestamp in a column of Expiration Time Stamp 323 from which to determine the expiration date and an Action 325, e.g., Wipe 327. In embodiments, note that the timestamp does not need to be synchronized with a network time protocol (NTP) or similar standard time reference. In embodiments, Action 325 includes an action taken with respect to the expired data in the address range, e.g., to invalidate the expired data. For example, Wipe 327 may include deletion of an encryption key for the expired data, as noted above, to effectively wipe the data. Other examples of methods to invalidate data include Zero 329, e.g., to forcibly write zeros into the data location. In embodiments, Interrupt on Invalid Access 331 includes an instruction to generate an interrupt acknowledgment to notify a host system that an attempt to access invalid data has been made. In some embodiments, expired data to be invalidated is marked as expired with a metadata flag.

Figure 4:
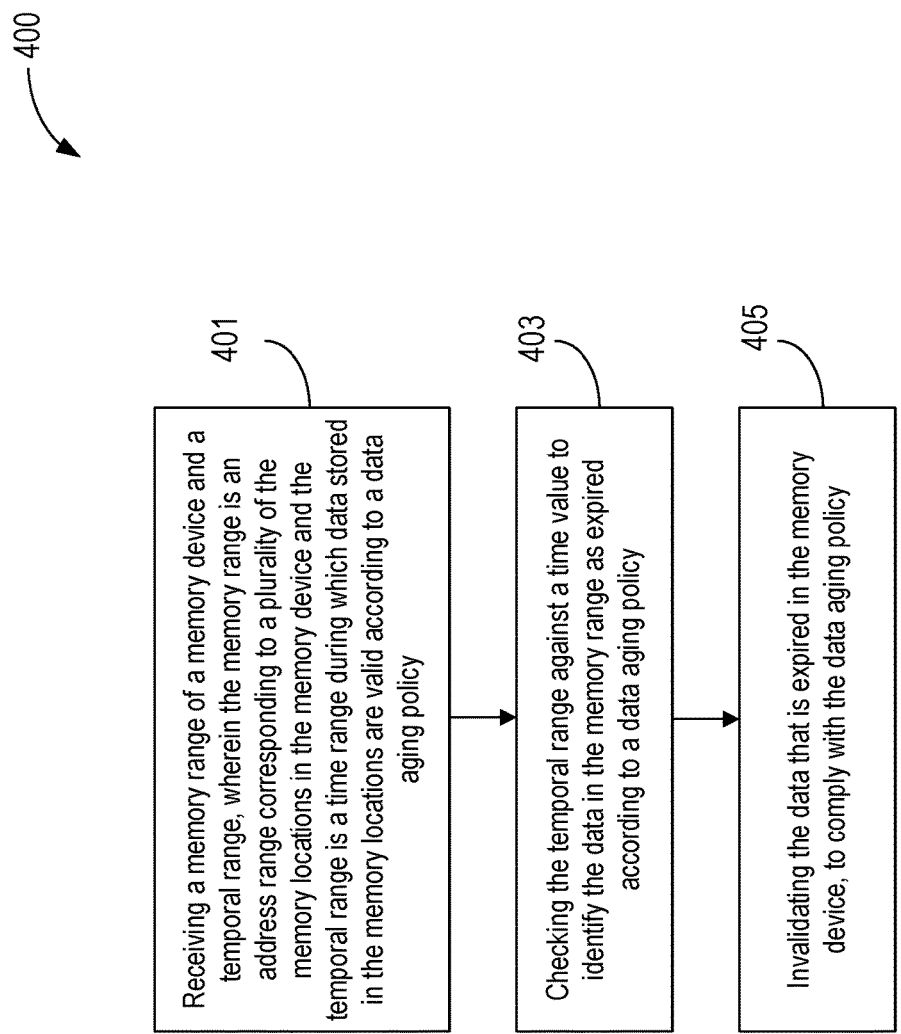
FIG. 4 is a flow diagram illustrating an example process, in accordance with embodiments of the disclosure.

FIG. 4 is a flow diagram illustrating an example process 400 that is performed by, e.g., a TDMU (e.g., TDMU 201 of FIG. 2), to identify data in a memory range as expired and to invalidate the data that is expired, according to embodiments of the disclosure. In the embodiment, at a first block 401, process 400 includes to receive a memory range of the memory device and a temporal range. In embodiments, the memory range is an address range corresponding to a plurality of the memory locations in a memory device and the temporal range is a time range during which data stored in the memory locations are valid according to a data aging policy. In embodiments, to receive the memory range of a memory device and the temporal range may include to receive or retrieve parameters, such as, e.g., a memory address, length, and TTL value, that are stored in an expiration table. Other parameters received may include e.g., what action (e.g., see Action 325 of FIG. 3) is to be taken once data has exceeded or is out of the TTL value and thus have expired.

At a next block 403, process 400 includes to check the temporal range against a time value to identify the data in the memory range as expired according to a data aging policy. In embodiments, the temporal ranges are checked every n units of time (or every cycle) by checking a time value provided by a timer or clock. In some embodiments, upon receipt of the memory range and the temporal range, TDMU 201 receives or records a timestamp associated with storage of data and from which the time value from the timer can be checked against. Furthermore, in some embodiments, for security reasons, the timer or the clock are implemented without an option to be reset.

At a next block 405, process 405 includes to invalidate the data that is expired in the memory device. In embodiments, the data is to be invalidated, to comply with the data aging policy. In embodiments, to invalidate the data includes to take an action or issue an instruction to an appropriate memory device to take associated actions (e.g., memory device 107), e.g., as described in connection with Action 325 of expiration table 313 of FIG. 2. In some embodiments, invalidating the data that is expired in the memory device includes invalidating the data when the memory module is decoupled from the platform interface. Note that in various embodiments as noted previously, the TDMU may be implemented by a memory controller and perform the same functions as described above. In some embodiments, the TDMU may include hardware logic coupled to embedded memory in a processor.

FIG. 5 illustrates an example electronic device 500 (e.g., a computer, a server, or some other electronic device) that may be suitable to practice selected aspects of the present disclosure. In embodiments, the system or electronic device 500 includes, one or more memories 504, coupled to a TDMU 555, e.g., such as a TDMU described in connection with FIGS. 1-4. As shown, electronic device 500 may include one or more processors or processor cores 502. For the purpose of this application, including the claims, the term "processors" refers to physical processors, and the terms "processor" and "processor cores" may be considered synonymous, unless the context clearly requires otherwise. In embodiments, memories 504 includes a memory module that further includes a battery source and a clock or timer coupled to TDMU 555, where the battery source is to provide power to the timer when a power supply from the system or platform is absent (e.g., when the module is decoupled from a PCB). In embodiments, the clock or timer keeps track of a current date or timestamp and is implemented without an option to be reset. In embodiments, a memory device (e.g., memory device 107 of FIG. 1) mounted on a memory module such as a DIMM includes any suitable type of memory device that includes data that is to be invalidated due to, e.g., a data aging policy. In some embodiments memories 504 includes a memory drive having a disk form factor. In embodiments, TDMU 555 may also be coupled to embedded memory in a processor (e.g., see processor 502) and may include, for example, high bandwith memory (HBM) or embedded DRAM (eDRAM). Note that TDMU 555 may be coupled to perform its actions with respect to memories 504 that are based on any suitable memory media that stores data that is subject to invalidation, e.g., NAND, 3D NAND, or other suitable materials, e.g., phase change memory (PCM or cross-point array).

For example, in some embodiments, a memory device to which TDMU 555 is coupled to perform invalidation of data includes an NVM device, e.g., a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

In embodiments, the memory module may be a DIMM, such as a double data rate (DDR) synchronous random-access memory (DDR SRAM) DIMM and/or the RAM components include a memory unit or medium including a cross-point memory array.

Note that a memory subsystem as described herein may be compatible with a number of memory technologies, such as DDR3 (Double Data Rate version 3, original release by JEDEC (Joint Electronic Device Engineering Council) on Jun. 27, 2007), DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications.

Additionally, electronic device 500 may include mass storage devices 506 (such as diskette, hard drive, compact disc read-only memory (CD-ROM) and so forth), input/output (I/O) devices 508 (such as display, keyboard, cursor control and so forth) and communication interfaces 510 (such as network interface cards, modems and so forth). In some embodiments, TDMU 555 may be coupled to mass storage devices 506 perform the same functions as described above in connection to FIGS. 1-4. In some embodiments, I/O device 508 may be a solid-state drive (SSD) including a memory device to which TDMU may be coupled to perform the same functions as described above in connection to FIGS. 1-4.

The elements may be coupled to each other via system bus 512, which may represent one or more buses. In the case of multiple buses, they may be bridged by one or more bus bridges (not shown). Each of these elements may perform its conventional functions known in the art. In particular, in some embodiments, memory 504 and mass storage devices 506 may be employed to store a working copy and a permanent copy of the programming instructions configured to perform one or more processes or memory/storage transactions for the electronic device 500. The programming instructions may be collectively referred to as controller logic 522. The various elements may be implemented by assembler instructions supported by processor(s) 502 or high-level languages, such as, for example, C, that can be compiled into such instructions.

The number, capability and/or capacity of the elements shown in FIG. 5 may vary, depending on whether electronic device 500 is used as a server, communication device, or some other type of computing device.

Otherwise, the constitutions of the elements shown in FIG. 5 may be known, and accordingly will not be further described. The terminology used herein is for the purpose of describing particular embodiments only and is not intended to be limiting of the disclosure. As used herein, the singular forms "a," "an" and "the" are intended to include plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Thus various example embodiments of the present disclosure have been described including, but not limited to:

Example 1 is an apparatus, comprising: a memory device including memory locations; and hardware logic coupled to the memory device to: receive from an interface, a memory range and a temporal range, wherein the memory range is an address range corresponding to a plurality of the memory locations in the memory device and the temporal range is a time range during which data stored in the memory locations are valid according to a data aging policy; check a time value to determine that the time value is outside of the temporal range and the data in the memory locations are expired; and invalidate the data that is expired in the memory device to comply with the data aging policy.

Example 2 is the apparatus of claim 1, wherein the time value is a current time and further comprising a timer or clock coupled to provide the current time to the hardware logic.

Example 3 is the apparatus of claim 2, further comprising a battery source coupled to the timer or clock to provide power to the timer or clock when a power supply from a platform is absent.

Example 4 is the apparatus of Example 1, wherein the apparatus is a dual-in-line-memory module (DIMM) and the hardware logic resides on the DIMM with the memory device.

Example 5 is the apparatus of Example 2, wherein the interface is a memory controller interface and the hardware logic is to invalidate the data when the DIMM is decoupled from the interface.

Example 6 is the apparatus of Example 1, wherein the apparatus is a memory drive and the hardware logic resides on the memory drive with the memory device.

Example 7 is the apparatus of Example 1, wherein the temporal range is a time-to-live (TTL) value and when the TTL value is expired, the data in the memory locations is identified as expired.

Example 8 is the apparatus of any one of Examples 1-7, wherein the hardware logic to invalidate the data includes to mark the memory range as expired, clear or delete an encryption key, or write zeros into a data location of the memory locations.

Example 9 is a method, comprising: receiving, by hardware logic coupled to a memory device having a plurality of memory locations, a memory range of the memory device and a temporal range corresponding to validity of data in the memory range, wherein the temporal range is a time range during which data stored in the memory locations are valid according to a data aging policy; checking, by the hardware logic, the temporal range against a time value to identify the data in the memory range as expired according to a data aging policy; and invalidating, by the hardware logic, the data that is expired in the memory device, to comply with the data aging policy.

Example 10 is the method of Example 9, wherein invalidating by the hardware logic, the data that is expired in the memory device includes invalidating the data when the memory device is decoupled from a platform interface.

Example 11 is the method of Example 9, wherein checking, by the hardware logic, the temporal range includes checking a timer or clock to determine if a time-to-live (TTL) value is expired or exceeded.

Example 12 is the method of Example 11, wherein the timer or clock is implemented without an option to be reset.

Example 13 is a system, comprising: a processor; a memory device coupled to the processor, wherein the memory device includes a plurality of memory locations; and hardware logic coupled to the memory device to: check a temporal range against a time value to identify data in a memory range as expired, wherein the memory range is an address range corresponding to the plurality of the memory locations in the memory device and the temporal range is a time range during which data stored in the memory locations are valid according to a data aging policy; and invalidate the data that is expired in the memory device, to comply with the data aging policy.

Example 14 is the system of Example 13, wherein the temporal range is a time-to-live (TTL) value.

Example 15 is the system of Example 13, wherein the memory device and the hardware logic are located on a memory module to be decoupled from the processor.

Example 16 is the system of Example 15, wherein the memory module is a DIMM.

Example 17 is the system of Example 16, further comprising a battery source and a timer coupled to the hardware logic on the DIMM and wherein the battery source to provide power to the timer when a power supply from the system is absent.

Example 18 is the system of Example 13, wherein a timer to provide the time value is implemented without an option to be reset.

Example 19 is the system of Example 13, wherein the memory device is included in a memory drive or is embedded memory included in the processor.

Example 20 is the system of any one of Examples 13-19, wherein to invalidate the data includes to mark the memory range as expired, delete a memory range encryption key, or forcibly zero memory locations of the data.

Example 21 is an apparatus comprising means to perform the method of Examples 9-12.

Various embodiments may include any suitable combination of the above-described embodiments, including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
   a memory device including memory locations; and
   hardware logic coupled to the memory device to:
   identify a table that includes indications of a plurality of memory ranges, indications of a plurality of temporal ranges, and indications of a plurality of data invalidation techniques, wherein:
   respective ones of the plurality of temporal ranges and respective ones of the plurality of data invalidation techniques correspond to respective ones of the plurality of memory ranges;
   respective memory ranges are an address range that correspond to a plurality of the memory locations in the memory device; and
   respective temporal ranges are a time range during which data stored in the respective memory ranges is valid according to a data aging policy;
   identify, based on an identification that a time value is outside of a temporal range of the plurality of temporal ranges, that the data in a corresponding memory range of the plurality of memory ranges is expired; and
   invalidate, based on a data invalidation technique that corresponds to the temporal range and the memory range, the expired data in the memory range.

2. The apparatus of claim 1, wherein the time value is a current time and further comprising a timer or clock coupled to provide the current time to the hardware logic.

3. The apparatus of claim 2, further comprising a battery source coupled to the timer or clock to provide power to the timer or clock when a power supply from a platform is absent.

4. The apparatus of claim 1, wherein the apparatus is a dual-in-line-memory module (DIMM) and the hardware logic resides on the DIMM with the memory device.

5. The apparatus of claim 4, wherein the interface is a memory controller interface and the hardware logic is to invalidate the data when the DIMM is decoupled from the interface.

6. The apparatus of claim 1, wherein the apparatus is a memory drive.

7. The apparatus of claim 1, wherein the temporal range is a time-to-live (TTL) value and when the TTL value is expired, the data in the corresponding memory range is identified as expired.

8. The apparatus of claim 1, wherein the plurality of invalidation techniques includes marking the memory range as expired, clearing or deleting an encryption key, and writing zeros into a data location of the memory locations.

9. A method, comprising:
   identifying a table that includes indications of a plurality of memory ranges, indications of a plurality of temporal ranges, and indications of a plurality of data invalidation techniques, wherein:
      respective ones of the plurality of temporal ranges and respective ones of the plurality of data invalidation techniques correspond to respective ones of the plurality of memory ranges;
      respective memory ranges are an address range that correspond to a plurality of the memory locations in the memory device; and
      respective temporal ranges are a time range during which data stored in the respective memory ranges is valid according to a data aging policy;
   identifying, based on an identification that a time value is outside of a temporal range of the plurality of temporal ranges, that the data in a corresponding memory range of the plurality of memory ranges is expired; and
   invalidating, based on a data invalidation technique that corresponds to the temporal range and the memory range, the expired data in the memory range.

10. The method of claim 9, wherein invalidating by the hardware logic, the data that is expired in the memory device includes invalidating the data when the memory device is decoupled from a platform interface.

11. The method of claim 9, wherein checking, by the hardware logic, the temporal range includes checking a timer or clock to determine if a time-to-live (TTL) value is expired or exceeded.

12. The method of claim 11, wherein the timer or clock is implemented without an option to be reset.

13. A system, comprising:
   a processor;
   a memory device coupled to the processor, wherein the memory device includes a plurality of memory locations; and
   hardware logic coupled to the memory device to:
      identify a table that includes indications of a plurality of memory ranges, indications of a plurality of temporal ranges, and indications of a plurality of data invalidation techniques, wherein:
         respective ones of the plurality of temporal ranges and respective ones of the plurality of data invalidation techniques correspond to respective ones of the plurality of memory ranges;
         respective memory ranges are an address range that correspond to a plurality of the memory locations in the memory device; and
         respective temporal ranges are a time range during which data stored in the respective memory ranges is valid according to a data aging policy;
      identify, based on an identification that a time value is outside of a temporal range of the plurality of temporal ranges, that the data in a corresponding memory range of the plurality of memory ranges is expired; and
      invalidate, based on a data invalidation technique that corresponds to the temporal range and the memory range, the expired data in the memory range.

14. The system of claim 13, wherein the temporal range includes a time-to-live (TTL) value.

15. The system of claim 13, wherein the memory device and the hardware logic are located on a memory module to be decoupled from the processor.

16. The system of claim 15, wherein the memory module is a dual-in-line-memory module (DIMM).

17. The system of claim 16, further comprising a battery source and a timer coupled to the hardware logic on the DIMM and wherein the battery source is to provide power to the timer when a power supply from the system is absent.

18. The system of claim 13, wherein a timer to provide the time value is implemented without an option to be reset.

19. The system of claim 13, wherein the memory device is included in a memory drive or is embedded memory included on the processor.

20. The system of claim 13, wherein to invalidate the data includes to mark the memory range as expired, delete a memory range encryption key, or forcibly zero memory locations of the data.

* * * * *